United States Patent [19]
Ohbayashi et al.

[11] Patent Number: 5,138,201
[45] Date of Patent: Aug. 11, 1992

[54] SENSE AMPLIFIER OPERABLE UNDER VARIABLE POWER SUPPLY VOLTAGE

[75] Inventors: Shigeki Ohbayashi; Atsushi Ohba, both of Hyogo, Japan

[73] Assignee: Mitsubishi Denki Kabushiki Kaisha, Tokyo, Japan

[21] Appl. No.: 542,225

[22] Filed: Jun. 22, 1990

[30] Foreign Application Priority Data

May 25, 1990 [JP] Japan ................................ 2-136554

[51] Int. Cl.⁵ ............................................. G11C 11/34
[52] U.S. Cl. ..................................... 307/530; 307/279; 307/355; 365/205
[58] Field of Search ......................... 307/530, 279, 355; 365/205, 207, 268

[56]  References Cited

U.S. PATENT DOCUMENTS

| | | | |
|---|---|---|---|
| 4,433,393 | 2/1984 | Oritani | 365/203 |
| 4,604,728 | 8/1986 | Okajima | 365/225.6 |
| 4,658,159 | 4/1987 | Miyamoto | 307/530 |
| 4,670,675 | 6/1987 | Donoghue | 307/530 |
| 4,802,138 | 1/1989 | Shimamure | 307/530 |
| 4,984,207 | 1/1991 | Tateno et al. | 307/530 |
| 5,029,127 | 7/1991 | Uchida et al. | 365/179 |
| 5,046,050 | 9/1991 | Kertis | 307/530 |

FOREIGN PATENT DOCUMENTS 61-246993 11/1986 Japan .
62-154288 7/1987 Japan .

OTHER PUBLICATIONS

"BiCMOS Current Source Reference Network for ULSI BiCMOS with ECL Circuitry", 1989 IEEE International Solid-State Circuits Conference.
Texas Instruments Incorporated, Semiconductor Process and Design Center, Dallas, Tex.

Primary Examiner—Stanley D. Miller
Assistant Examiner—Scott A. Ouellette
Attorney, Agent, or Firm—Lowe, Price, LeBlanc & Becker

[57] ABSTRACT

Disclosed is a sense amplifier employing an emitter coupled logic (ECL) circuit. A constant voltage generating circuit independent of a change or a fluctuation of a power supply voltage level is provided. Two current-mirror circuits supply constant currents to the ECL circuit based on a generated constant voltage. Since a constant current independent of the change of power supply voltage level is supplied to the ECL circuit, the ECL circuit reliably converts a small potential difference generated between I/O lines into a current signal. Accordingly, no erroneous reading operation is performed.

8 Claims, 11 Drawing Sheets

SENSE AMPLIFIER OPERABLE UNDER VARIABLE POWER SUPPLY VOLTAGE

BACKGROUND OF THE INVENTION

1. Field of the Invention

The present invention relates generally to sense amplifiers, and more particularly, to a sense amplifier capable of preforming predetermined operations under no influence of variation of a power supply voltage. The present invention has particular applicability to static random access memories.

2. Description of the Background Art

Generally, semiconductor memories are widely used in various apparatuses such as a computer system and the like. A semiconductor memory has a great number of memory cells to and from which data is written and read. Out of the semiconductor memories, especially often used are dynamic random access memories (DRAM) and static random access memories (referred to as "SRAM" hereinafter). In general, a great number of memory cells are connected to bit lines in DRAMs and SRAMs. In a reading operation, a data signal stored in a memory cell is applied to a bit line to generate a small potential difference between bit lines. A sense amplifier senses the generated small potential difference and amplifies the same, so that the stored data is read. While the present invention is generally applicable to a sense amplifier for amplifying a small potential difference appearing between two signal lines or bit lines, a description will be made on SRAM as an example in the following.

In recent years, the requirements on both the enhancement of speed and low power consumption become more demanding, for which improvements have been made. For example, SRAMs, especially emitter coupled logic (referred to as "ECL" hereinafter) SRAMs operable at a high speed are used in order to constitute a cache memory for use in a large-scaled general-purpose computer. The ECLSRAMs are known as SRAMs using logic signals of a ECL level. A "H" level (logical high) of an input signal and a "L" (logical low) level thereof are defined as −0.9 volt and −1.7 volts in the ECL level, respectively.

FIG. 9 shows a conventional SRAM. In the drawing, in order to simplify the description, shown is a memory cell array having memory cells in four rows by four columns. The SRAM shown in FIG. 9 is described in, for example, U.S. Pat. No. 4,433,393. Referring to FIG. 9, the SRAM comprises an X decoder 1 responsive to an X address signal for activating word line driving circuits 2a-2d, word lines 3a-3d connected to outputs of the word line driving circuits 2a-2d, a Y decoder 4 responsive to a Y address signal for activating bit line selecting circuits 5a-5d, bit line pairs of 6a and 6b through 9a and 9b, and memory cells MC00-MC33 respectively connected between each of the word lines 3a-3d and each of the bit line pairs of 6a and 6b through 9a and 9b.

FIGS. 10 and 11 show examples of memory cells applicable to the SRAM, wherein FIG. 10 shows a high resistance load type NMOS memory cell and FIG. 11 shows a CMOS type memory cell.

Referring to FIG. 9 again, each of bit line load resistances 10a–13b is connected to each one end of the bit lines. The respective resistances 10a–13b are connected to a first power supply line (Vcc) 15 through a level shifter 14. Each of transfer gate transistors 16a–19b is connected to each of the other ends of the respective bit lines 6a–9b. The respective transistors of each transistor pair of the transistor pairs of 16a and 16b through 19a and 19b have gates connected to each output of the bit line selecting circuits 5a–5d, respectively. The respective bit line pairs of 6a and 6b through 9a and 9b are connected to I/O line pairs of 20a and 20b.

The I/O line pair of 20a and 20b is connected to two inputs of a sense amplifier 21. The sense amplifier 21 is connected to receive an activation signal SE generated from a sense amplifier selecting circuit 22. Two outputs the sense amplifier 21 are connected to an output buffer 24 through a common data line pair of 23a and 23b. The output buffer 24 receives a signal of a SCL level through the common data line pair of 23a and 23b.

The other ends of I/O line pair of 20a and 20b are connected to a driving circuit 29 for driving the same. The driving circuit 29 includes four NMOS transistors 25 through 28 connected between a first power supply line 15 (Vcc) and a second power supply line ($V_{EE}$) 30. The driving circuit 29 is connected to receive an output signal from a writing amplifier 31.

FIG. 12 shows a circuit diagram of the sense amplifier 21. Referring to FIG. 12, the sense amplifier comprises two npn transistors 33 and 34 and a current source 35. The transistor 33 has a base connected to the I/O line 20a and a collector connected to the common data line 23a. Similarly, the transistor 34 has a base connected to the I/O line 20b and a collector connected to the common data line 23b. Emitters of the transistors 33 and 34 are connected with each other, which is further connected to the current source 35. The current source 35 includes an NMOS transistor 36 connected to the second power supply line 30. The transistor 36 has a gate connected to receive the sense amplifier activation signal SE. The activation signal SE has a potential of an MOS level. Namely, the "H" level of the signal SE has a first power supply potential and the "L" level thereof has a second power supply potential.

Now, operations of the SRAM shown in FIG. 9 will be described. First, in a writing operation, an input data signal Din is applied to the writing amplifier 31 through an input buffer 31'. The writing amplifier 31 amplifies the input signal Din and applies the amplified signal to the driving circuit 29 through two signal lines 32a and 32b. The driving circuit 29 drives the I/O lines 20a and 20b in response to the received signal. The Y decoder 4 and the bit line selecting circuits 5a and 5d selectively turn on the transfer gate transistors 16a through 19b, so that voltages on the I/O line pairs of 20a and 20b are selectively applied to one pair of the bit line pairs of 6a and 6b through 9a and 9b. The X decoder 1 and the word line selecting circuits 2a–2d select one word line, whereby a signal based on the input data signal Din is written in a designated memory cell.

Now, a reading operation will be described in more detail. In the following, a description will be made of a case where data stored in the memory cell MC00 is read. The X decoder 1 applies a low level signal to two inputs of the word line selecting circuit 2a. Accordingly, the word line 3a attains a high level. High level signals are inputted to at least one of two inputs of each of the other word line selecting circuits 2b–2d, so that the other word lines 3b–3d attain a low level. As a result, only the word line 3a is selected.

Similarly, the Y decoder 4 applies low level signals to two inputs of the bit line selecting circuit 5a. Accordingly, the bit line selecting circuit 5a outputs a high level signal, so that the transfer gate transistors 16a and 16b are rendered conductive, which therefore means that the memory cell MC00 is selected.

When the memory cell MC00 is selected, a potential difference is generated between the bit lines 6a and 6b in response to the data signal stored in the memory cell MC00. In order to transmit the data to the output buffer 24, the sense amplifier activating signal SE attains the high level. Accordingly, the transistor 36 provided in the current source 35 is turned on, so that the sense amplifier 21 is activated. The potential difference between the bit lines generated in response to the data stored in the memory cell MC00 appears on the I/O line pair of 20a and 20b through the transfer gate transistors 16a and 16b. The potential difference is amplified by the sense amplifier 21 and thereafter is applied to the output buffer 24. While the above-described reading operation is carried out, both of the outputs 32a and 32b of the writing amplifier are fixed to a low level. On the other hand, in writing, a potential on one bit line to which a low level data signal is written is made to be of a low potential and a potential on the other bit line is made to be of a high potential.

In case none of the memory cells connected to one of the I/O line pairs of 20a and 20b is selected, all the word lines 3a-3d and all the outputs of the bit line selecting circuits 5a through 5d attain a low level, so that none of the data signals stored in the memory cells is applied to the I/O line pair of 20a and 20b. On this occasion, since the sense amplifier 21 does not need to be activated, a low level sense amplifier activating signal SE is applied in order to reduce power consumption. Accordingly, the current source 35 is turned off to render the sense amplifier 21 non-activated.

FIG. 13 shows a circuit diagram of the output buffer 24. Referring to FIG. 13, the common data lines 23a and 23b are connected to nodes Na and Nb, respectively. npn transistors 61 and 62 clamp potentials of the nodes Na and Nb. The clamped potentials are determined by a diode 63 and a constant current source 64. Accordingly, although signal currents flow in the common data lines 23a and 23b, potentials thereon do not fluctuate.

The signal currents from the sense amplifier flow to common data line 23a through, for example, the transistor 62. Accordingly, a current signal is converted into a voltage signal by a resistance 66, and the converted voltage signal is applied to a base of the transistor 76. The signal currents flowing in the common data line 23b are also converted into voltage signals by a resistance 65 and the converted voltage signals are applied to a base of the transistor 67. An npn transistor 76, a diode 68, an npn transistor 69 and a resistance 70 constitute an emitter-follower circuit. Accordingly, a level of a voltage of a node N2 is shifted by a voltage $V_{BE}$ between a base and an emitter of the transistor 76. The level-shifted voltage is applied to an ECL circuit in the succeeding stage through a node N3.

The ECL circuit comprises npn transistors 71, 72, 73 and 75 and resistances 74 and 77. The transistor 75 has a current drivability large enough to drive other circuits connected to an output terminal Dout. Inputs of the ECL circuit, that is, bases of the transistors 71 and 72 are connected to the nodes N3 and N4, respectively. The transistor 73 and the resistance 74 constitute a constant current source. Accordingly, in response to potentials of the nodes N3 and N4, a voltage signal is applied to a base of the transistor 75 through a common connection node N5 between the resistance 77 and the transistor 72. As a result, an output data signal is outputted through the transistor 75 and the terminal Dout.

Conventionally, two voltage levels are used for a power source of the ECLSRAM. More specifically, $-0.5$ volt and $-5.2$ volts are used as a power source $V_{EE}$ (Vcc is set to 0 volt). Additionally, since such semiconductor memories as SRAMs are used in various apparatuses as described above, a power supply voltage level often fluctuates. If the power supply voltage level changes or fluctuates, problems arise.

Namely, in the sense amplifier shown in FIG. 12 voltage between a gate and a source of the transistor 36 in the current source 35 changes as a voltage on the power supply line 30 changes or fluctuates. This causes the currents to be changed which flow in the common data lines 23a and 23b through the transistors 33 and 34. The change of the signal currents flowing in the common data lines 23a and 23b cause erroneous reading of data in the output buffer shown in FIG. 13. Namely, the change of the signal currents flowing in the common data lines 23a and 23b signifies that the currents flowing in the transistors 61 and 62 change. As a result, potentials at the nodes N1 and N2 change by the effects of the resistances 65 and 66. Particularly, the potentials at the nodes N1 and N2 sometimes drop to be lower than the potential at the node N, Whereby the transistors 61 and 62 operate in a saturation region. Accordingly, a switching speed of the transistors 61 and 62 is reduced. In addition, it is pointed out that change or fluctuation of the potentials at the nodes N1 and N2 leads to erroneous reading of a data signal. This is possible because the transistors 67 and 76 operate in response to the potentials at the nodes N1 and N2, so that the ECL circuit in the succeeding stage might operate erroneously.

SUMMARY OF THE INVENTION

One object of the present invention is to prevent an erroneous reading operation, due to a change of a power supply voltage level in a sense amplifier.

Another object of the present invention is to prevent reduction of a reading speed of a sense amplifier due to a change of a power supply voltage level.

Yet another object of the present invention is to prevent an erroneous reading operation due to a change of a power supply voltage level in a semiconductor memory device.

Still another object of the present invention is to prevent reduction of a reading speed of a semiconductor memory device due to a change of a power supply voltage level.

Briefly stated, a sense amplifier according to the present invention comprises a potential difference current converting circuit for converting a potential difference signal generated between two signal lines into a current signal, a constant voltage source for generating a predetermined constant voltage independently of changes of a power supply voltage, a constant current source for supplying a constant current based on the constant voltage generated from the constant voltage source, and a current voltage converting circuit responsive to the current signal outputted from the potential difference current converting circuit for generating a voltage signal. The constant current source supplies a constant current to the potential difference current converting circuit in response to an activation signal for activating a sense amplifier.

In the operation, since the constant current source supplies the constant current to the potential difference current converting circuit based on the constant voltage generated from the constant voltage source, even if the power supply voltage changes, the converted current signal is not affected. Accordingly, the current voltage converting circuit can be operated in response to the current signal which is not affected, so that erroneous reading of a current signal can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
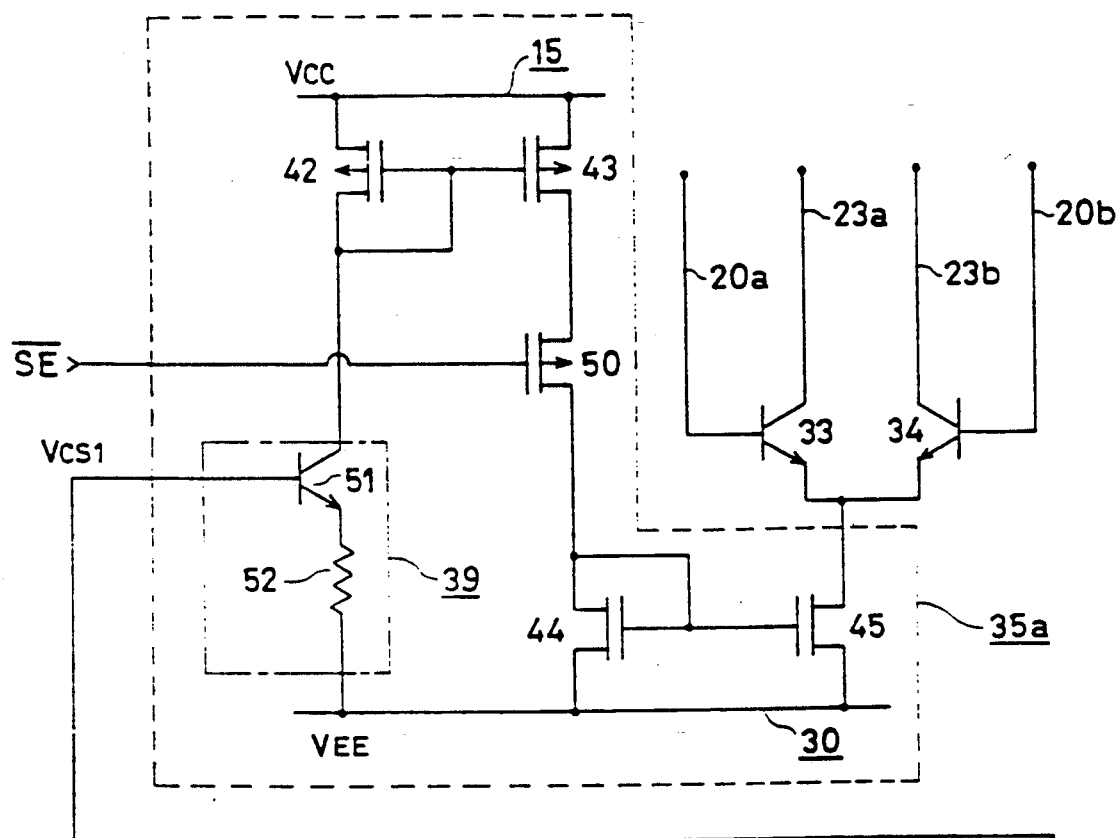
FIGS. 1 through 8 are circuit diagrams of sense amplifiers according to embodiments of the present invention.
Figure 1:
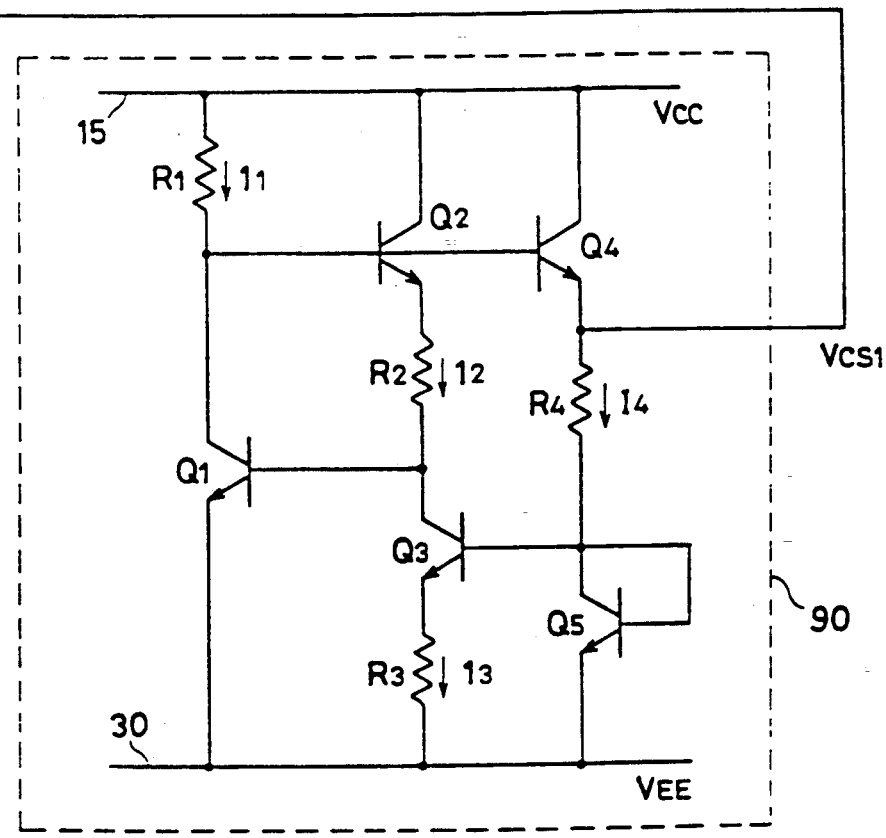
Figure 2:
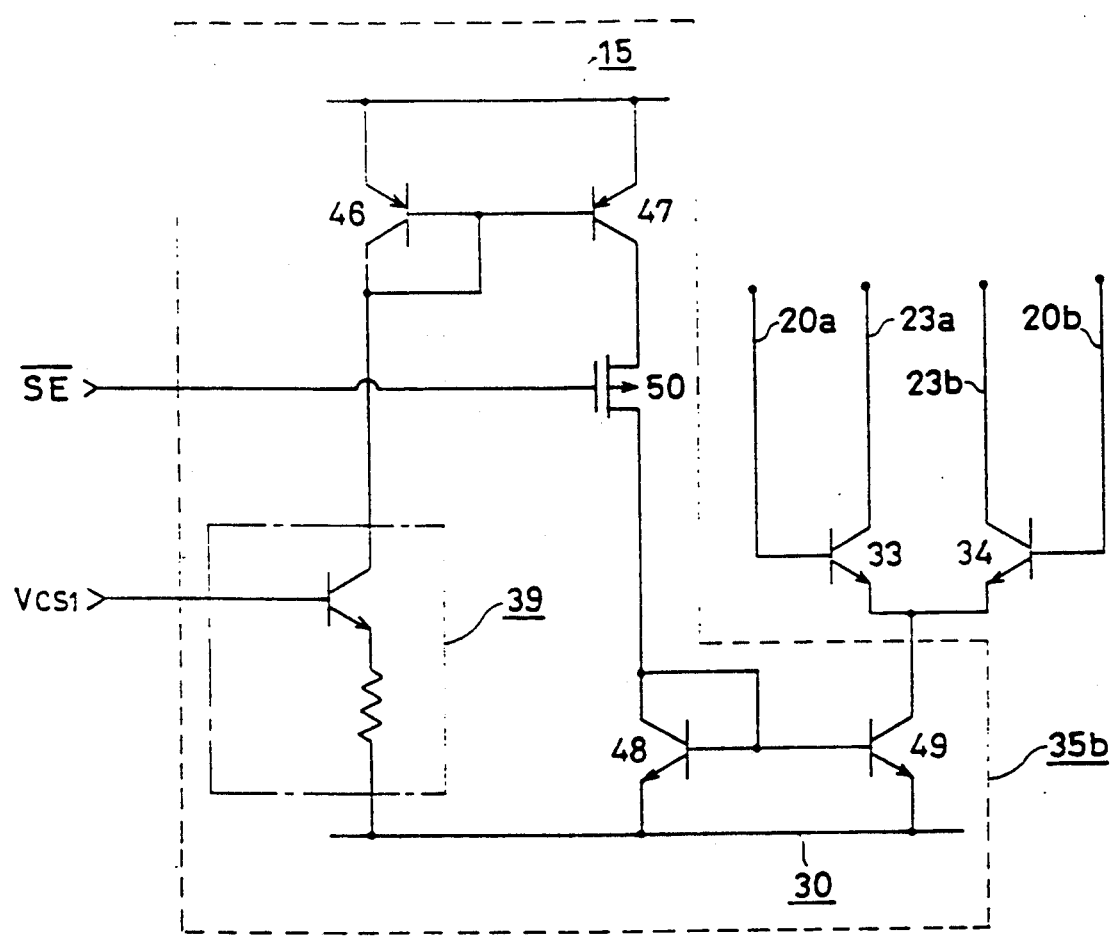

FIG. 1 shows differential sense amplifier according to one embodiment of the present invention. Referring to FIG. 1, the sense amplifier comprises an ECL circuit formed by npn transistors 33 and 34, a constant current supplying circuit 35a for supplying a constant current to the ECL circuit, and a constant voltage generating circuit 90 for generating a constant voltage which is not affected by a change of a power supply voltage. The constant current supplying circuit 35a includes PMOS transistors 42, 43 and 50, NMOS transistors 44 and 45, an npn transistor 51 and a resistance 52 connected between a first power supply line (Vcc) 15 and a second power supply line ($V_{EE}$) 30. The transistors 42 and 43 constitute a first current-mirror circuit and the transistors 44 and 45 constitute a second current-mirror circuit. The transistor 42 is diode-connected. More specifically, the transistor 42 has a gate and a drain connected together. The transistor 44 is also diode-connected. A base of the transistor 51 is connected to receive a constant voltage $V_{CS1}$ from the constant voltage generating circuit 90. Accordingly, the transistor 51 and the resistance 52 constitute a constant current source 39. The transistor 50 connected between the first and second current-mirror circuits, that is, between the transistors 43 and 44, forms a current switch. A gate of the transistor 50 is connected to receive a sense amplifier activation signal $\overline{SE}$.

The constant voltage generating circuit 90 comprises npn transistors Q1 through Q5 and resistances R1 through R4 connected between the first power supply line 15 and the second power supply line 30. Generation of a constant voltage by the circuit 90 will be described in more detail later.

In a reading operation, when a voltage difference based on a data signal stored in a memory cell is obtained between the I/O line pair of 20a and 20b, a sense amplifier activation signal $\overline{SE}$ of a low level is applied. Accordingly, the transistor 50 is turned on in response to the signal $\overline{SE}$. A constant current entering the constant current source 39 flows as a drain current of the transistor 42. As a result, a voltage between a gate and a source of the transistor 42 is fixed. Since the transistor 43 has a gate connected to the gate of the transistor 42, a drain current having a value of a real number multiple of the drain current of the transistor 42 flows through the transistor 43. As a result, the drain current of the transistor 43 becomes dependent on a power supply voltage as much as the constant current source 39 is dependent on the same by the effects of the first current-mirror circuit. More specifically, since the constant voltage $V_{CS1}$ generated by the constant voltage generating circuit 90 is not affected by a change or a fluctuation of the power supply voltage, neither is the constant current supplied by the constant current source 39 affected, whereby the drain current flowing in the transistor 43 is not affected by the change of the power supply voltage level.

A ratio of the drain currents flowing in the transistors 42 and 43 is determined by a ratio of channel widths of the respective transistors. In addition, a value of a drain current flowing in the transistor 45 becomes a real number multiple of a current flowing in the transistor 44, that is, a current flowing in the transistor 43 due to the effects of the second current-mirror circuit comprising the transistor 44 and 45. Also in this case, a ratio of the drain currents flowing in the transistors 44 and 45 is fixed by a ratio of the channel widths of the transistors 44 and 45.

Since the constant current sources of the first and second current-mirror circuits are relatively stable with respect to the change of the power supply voltage, in case the constant current source 39 is barely dependent on the power supply voltage, the constant current supplying circuit 35a can supply a stable constant current.

When the reading operation is not carried out, a sense amplifier activating signal $\overline{SE}$ of a high level is applied, so that the transistor 50 is turned off. Accordingly, no current is supplied to the second current-mirror circuit, whereby the constant current supplying circuit 35a is turned off. As a result, a power consumption of the sense amplifier in a non-activated state is reduced.

The constant voltage $V_{CS1}$ generated by the constant voltage generating circuit 90 is maintained at a constant level regardless of the change or the fluctuation of the power supply voltage. Namely, A potential difference $V_{DIF}$ ($=V_{CS1}-V_{EE}$) between the constant voltage $V_{CS1}$ and the second power source $V_{EE}$ is maintained at a constant level. Description will be made on this point hereinafter. In the following description, resistance values of the resistances R1 through R4 are denoted as R1 through R4 and currents flowing in the respective resistances R1 through R4 are denoted as I1 through I4. Additionally, voltages between bases and emitters of the respective transistors Q1 through Q5 are denoted as $V_{BE1}$ through $V_{BE5}$, respectively. Furthermore, since a current amplifying rate of each transistor is set to be large enough, a base current can be assumed to be negligible.

The potential difference $V_{DIF}$ between the output voltage $V_{CS1}$ and the power source $V_{EE}$ becomes a sum of the base-emitter voltage $V_{BE5}$ of the transistor Q5 and a voltage between the opposite ends of the resistance R4, so that it can be expressed as follows.

$$V_{DIF} = V_{CS1} - V_{EE} = V_{BE5} + R4 \cdot I4 \quad (1)$$

Since a potential difference between the first power source $V_{cc}$ and the second power source $V_{EE}$ becomes a sum of a voltage between the opposite ends of the resistance R1, the base-emitter voltage $V_{BE2}$ of the transistors Q2, a voltage between the opposite ends of the resistance R2 and the base-emitter voltage $V_{BE1}$ of the transistor Q1, it can be expressed as follows.

$$V_{cc} - V_{EE} R1 \cdot I1 + V_{BE2} + R2 \cdot I2 + + V_{BE1} \quad (2)$$

The potential difference between Vcc and $V_{EE}$ is also a sum of the voltage between the opposite ends of the resistance R1, the base-emitter voltage $V_{BE4}$ of the transistor Q4, the voltage between the opposite ends of the resistance R4 and the base-emitter voltage $V_{BE5}$ of the transistor Q5, so that it can be expressed as follows.

$$V_{cc} - V_{EE} = R1 \cdot I1 + V_{BE4} + R4 \cdot I4 + V_{BE5} \quad (3)$$

From the equations (2) and (3), the voltage between the opposite ends of the resistance R4 will be expressed as follows.

$$R4 \cdot I4 = V_{BE1} + V_{BE2} + R2 \cdot I2 - V_{BE4} - V_{BE5} \quad (4)$$

By substituting the equation (4) in the equation (1), the following equation can be obtained.

$$V_{DIF} = V_{BE1} + V_{BE2} - V_{BE4} + R2 \cdot I2 \quad (5)$$

Herein, since the base-emitter voltage $V_{BE5}$ of the transistor 5 is also a sum of $V_{BE3}$ and a voltage between the opposite ends of the resistance R3, the following equation can be obtained.

$$V_{BE5} = V_{BE3} = R3 \cdot I3 \quad (6)$$

Base currents of the respective transistors Q1 and Q3 are small enough to be ignored as compared with the currents I2 and I3. In addition, the following equation can be obtained with respect to I2 and I3.

$$I2 \approx I3 \quad (7)$$

From the equations (6) and (7), the voltages at the opposite ends of the resistance R2 can be expressed as follows.

$$R2 \cdot I2 \approx R2 \cdot I3 = (V_{BE5} - V_{BE3}) \cdot R2/R3 \quad (8)$$

By substituting the equation (8) in the equation (5), the following equation can be obtained.

$$V_{DIF} = V_{BE1} + V_{BE2} - V_{BE4} + (V_{BE5} - V_{BE3}) \cdot R2/R3 \quad (9)$$

While the change of the power supply voltage causes the respective current values I1 through I4 to change, a change of a base-emitter voltage $V_{BE}$ of each transistor is very small. Accordingly, from the equation (9), it is understood that the potential difference $V_{DIF}$ is maintained constant independently of the change of the power supply voltage.

Figure 13:
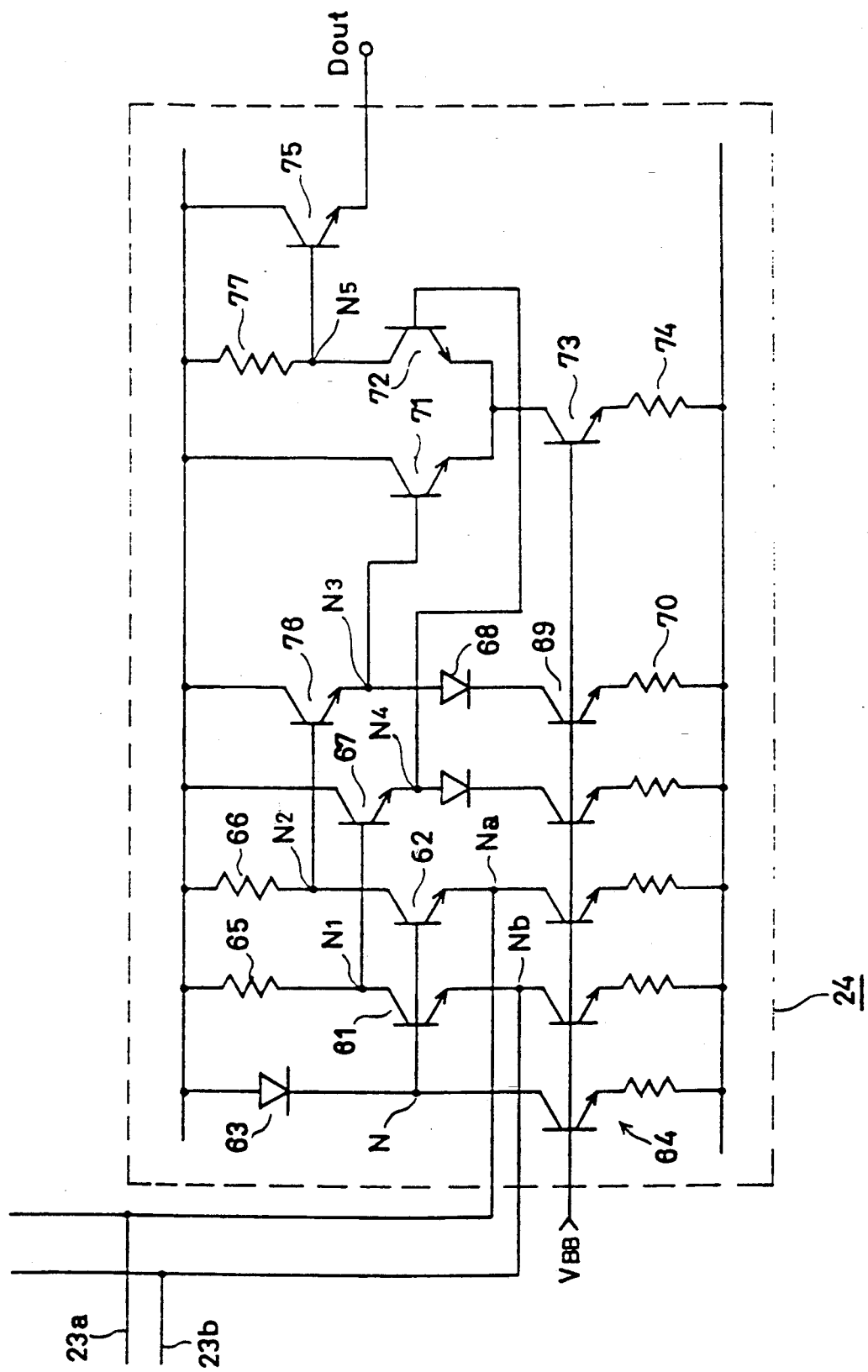
FIG. 13 is a circuit diagram of an output buffer shown in FIG. 9.

Accordingly, even if a power supply voltage level changes or fluctuates, a constant current is supplied to the transistors 33 and 34 from the constant current supplying circuit 35a shown in FIG. 1, so that signal currents flowing in the common data lines 23a and 23b have a constant value. As a result, in the output buffer 24 shown in FIG. 13, the potentials at the nodes N1 and N2 do not change as a power supply voltage level changes or fluctuates, thereby preventing the transistors 67 and 76 from malfunctioning. This signifies that no erroneous data reading occurs in the output buffer 24. In addition to the above, since the potentials at the nodes N1 and N2 are prevented from dropping below that at the node N3, the transistors 61 and 62 are not saturated. Namely, the transistors 61 and 62 operate in an non-saturation region, so that a predetermined switching speed can be obtained. That is, reduction of a reading speed due to the change of the power supply voltage can be prevented.

Now, referring to FIGS. 2 through 8, other embodiments of the present invention will be described. A sense amplifier 2 shown in FIG. 2 uses pnp transistors 46 and 47 and npn transistors 48 and 49 in place of the PMOS transistors 42 and 43 and the NMOS transistors 44 and 45 shown in FIG. 1.

Figure 3:
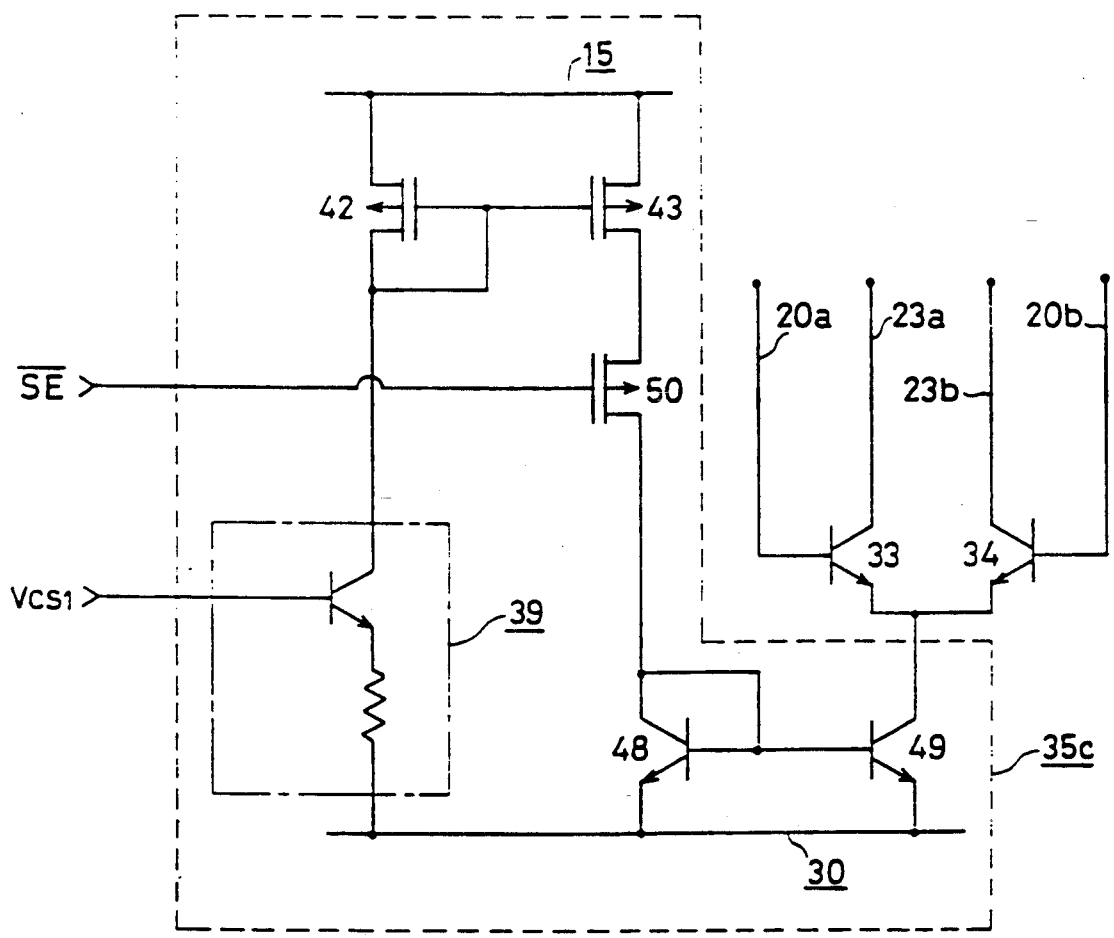

Referring to FIG. 3, npn transistors 48 and 49 are connected in place of the NMOS transistors 44 and 45 constituting the second current-mirror circuit shown in FIG. 1.

Figure 4:
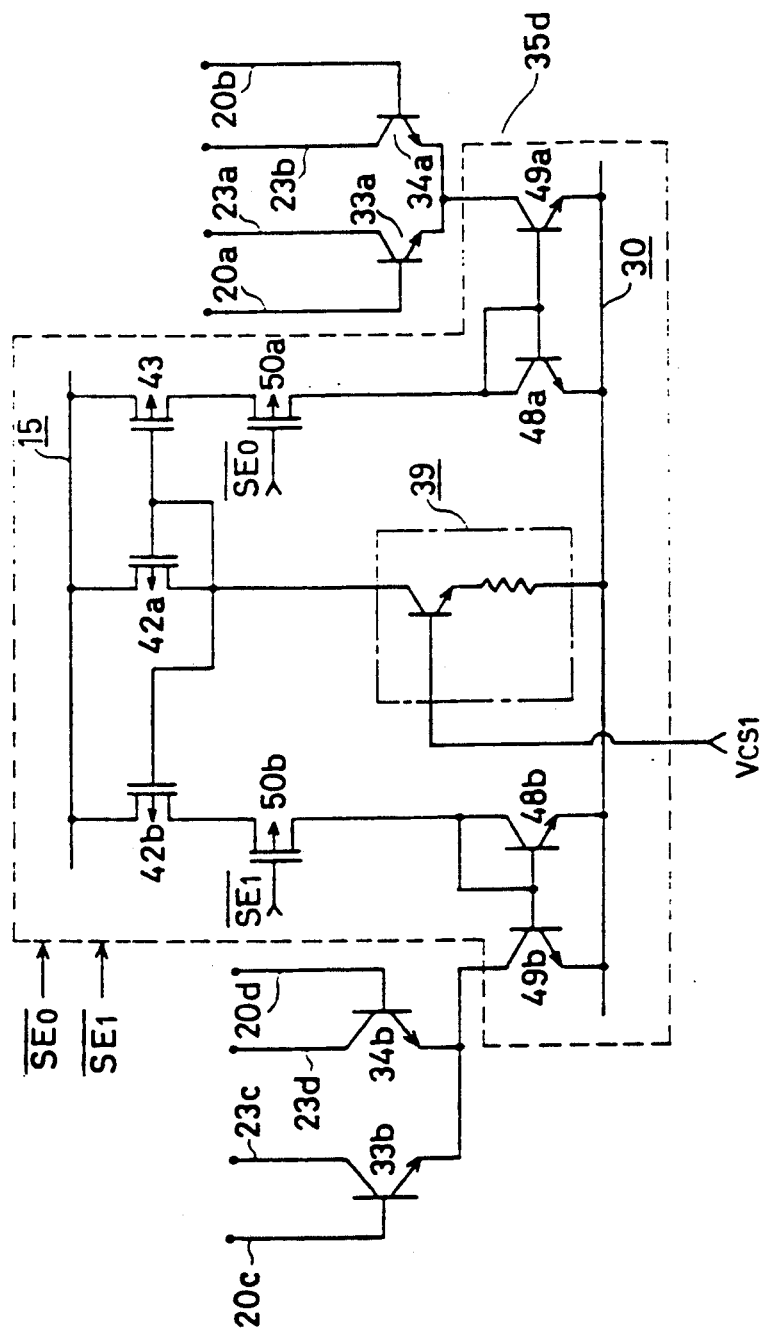

Referring to FIG. 4, shown is a constant current supplying circuit 35d capable of supplying constant currents to two ECL circuits. npn transistors 33a and 34a constitute a first ECL circuit and npn transistors 33b and 34b constitute a second ECL circuit. The first ECL circuit is connected to the I/O line pair of 20a and 20b and the common data line pair of 23a and 23b. Similarly, the second ECL circuit is also connected to a second I/O line pair of 20c and 20d and a second common data pair of 23c and 23d. The constant current supplying circuit 35d includes two PMOS transistors 42b and 50b and npn transistors 48b and 49b in addition to a circuit 35c shown in FIG. 3. Namely, the transistors 48b and 49b constitute a current-mirror circuit. A transistor 50a has a gate of connected to receive a first sense amplifier activating signal $\overline{SEO}$. Similarly, the transistor 50b has a gate connected to receive a second sense amplifier activating signal $\overline{SE1}$.

Transistors 42a and 43 constitute a first current-mirror circuit. Transistors 48a and 49a constitute a second current-mirror circuit. The transistors 42a and 42b constitute a third current-mirror circuit. The transistors 48b and 49b constitute a fourth current-mirror circuit. A current source 39 is used in common by the first and third current-mirror circuits.

Figure 5:
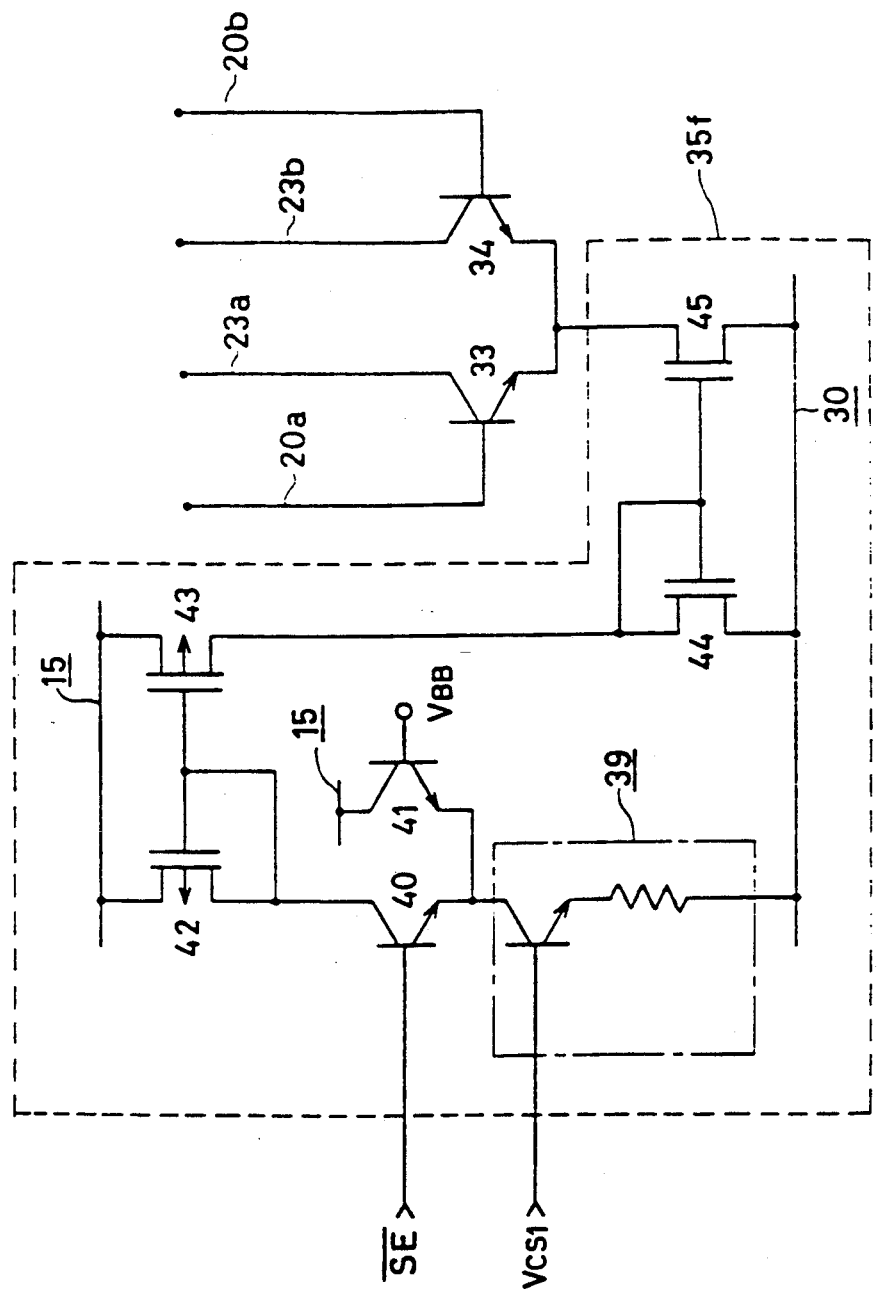

A constant current supplying circuit 35f shown in FIG. 5 employs two pnp transistors 40 and 41 in place of the PMOS transistor 50 shown in FIG. 1. More specifically, the transistor 40 is connected between the transistor 42 and the constant current source 39, and the transistor 41 is connected between the emitter of the transistor 40 and the first power supply line 15. The transistor 41 is connected such that a base thereof receives a reference potential $V_{BB}$. The transistor 40 has a base connected to receive a sense amplifier activating signal $\overline{SE}$.

In the operation, a potential of the signal $\overline{SE}$ and the reference potential $V_{BB}$ are compared with each other by the transistors 40 and 41. The transistor 40 is turned on based on the comparison result, whereby the circuit 35f starts supplying the constant currents. Accordingly, the sense amplifier is activated.

Figure 6:
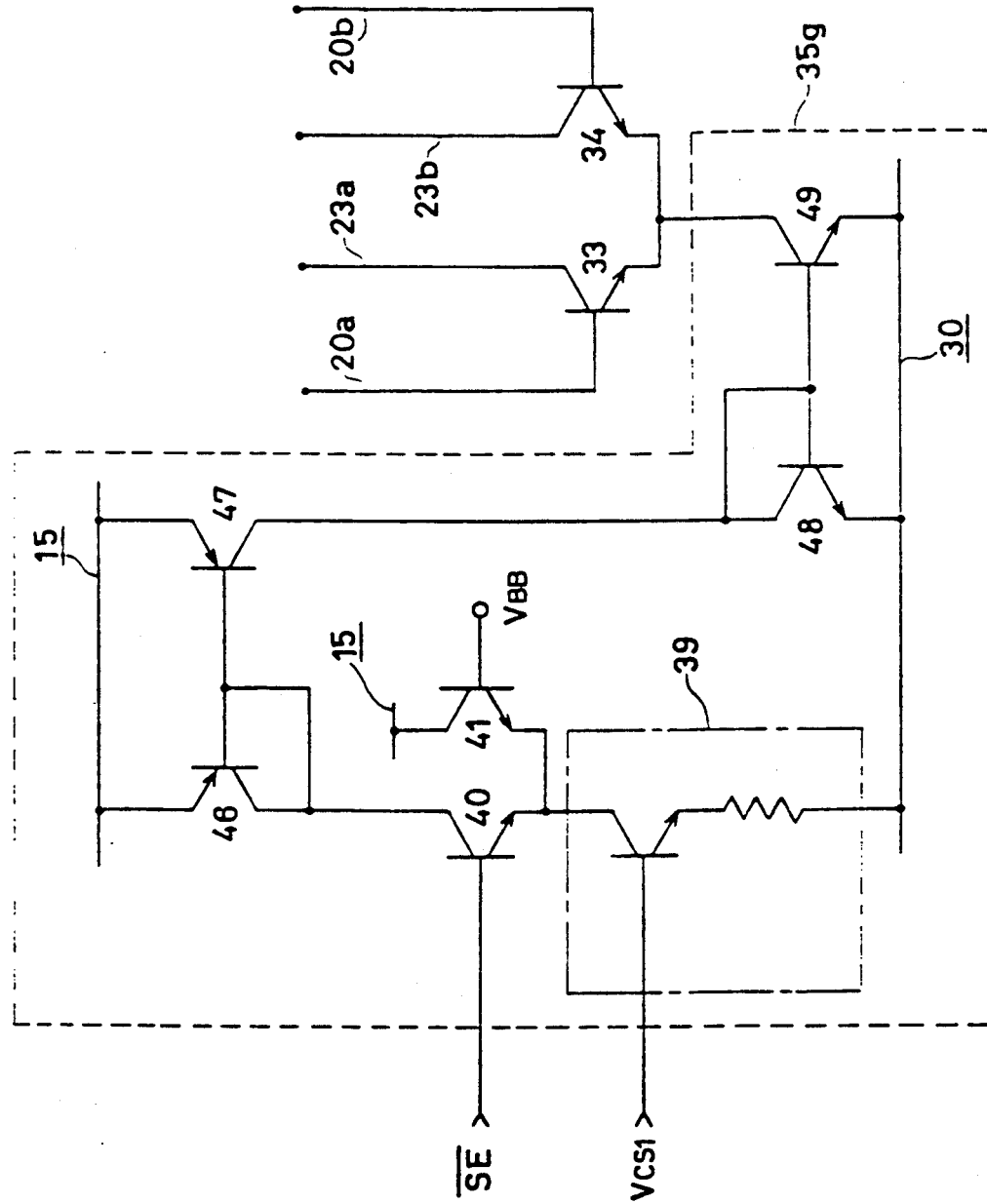

A constant current supplying circuit 35g shown in FIG. 6 employes pnp transistors 46 and 47 and npn transistors 48 and 49 in place of the transistors 42 through 45 shown in FIG. 5.

Figure 7:
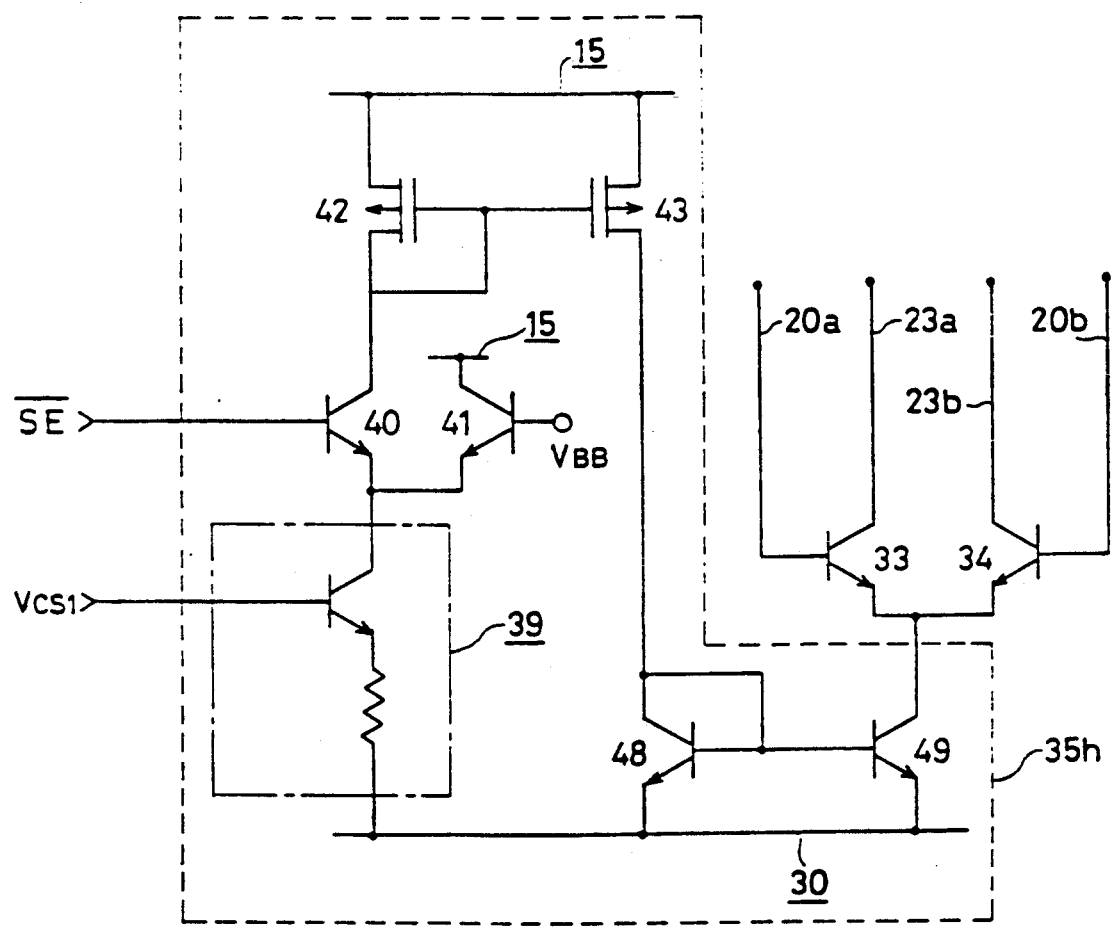

A constant current supplying circuit 35h shown in FIG. 7 employs npn transistors 48 and 49 in place of the transistors 44 and 45 shown in FIG. 5.

Figure 8:
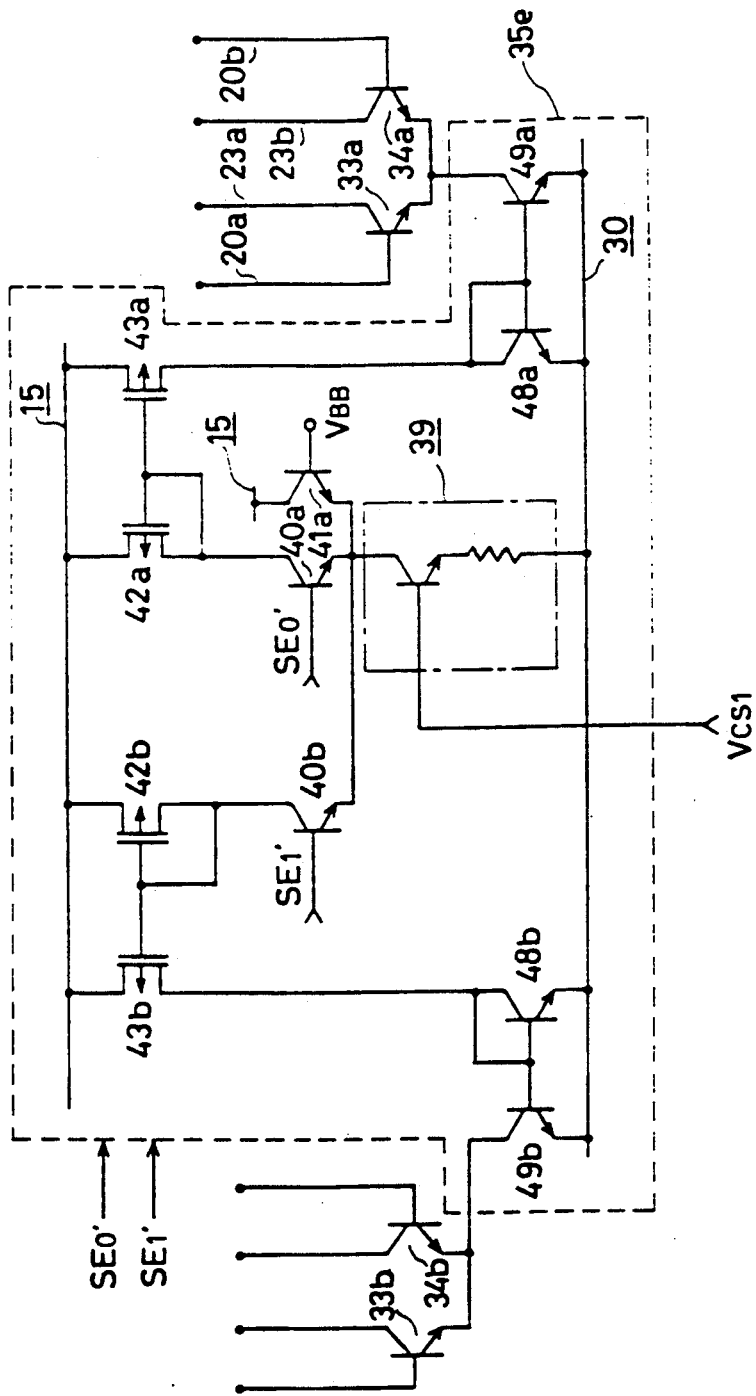
Figure 9:
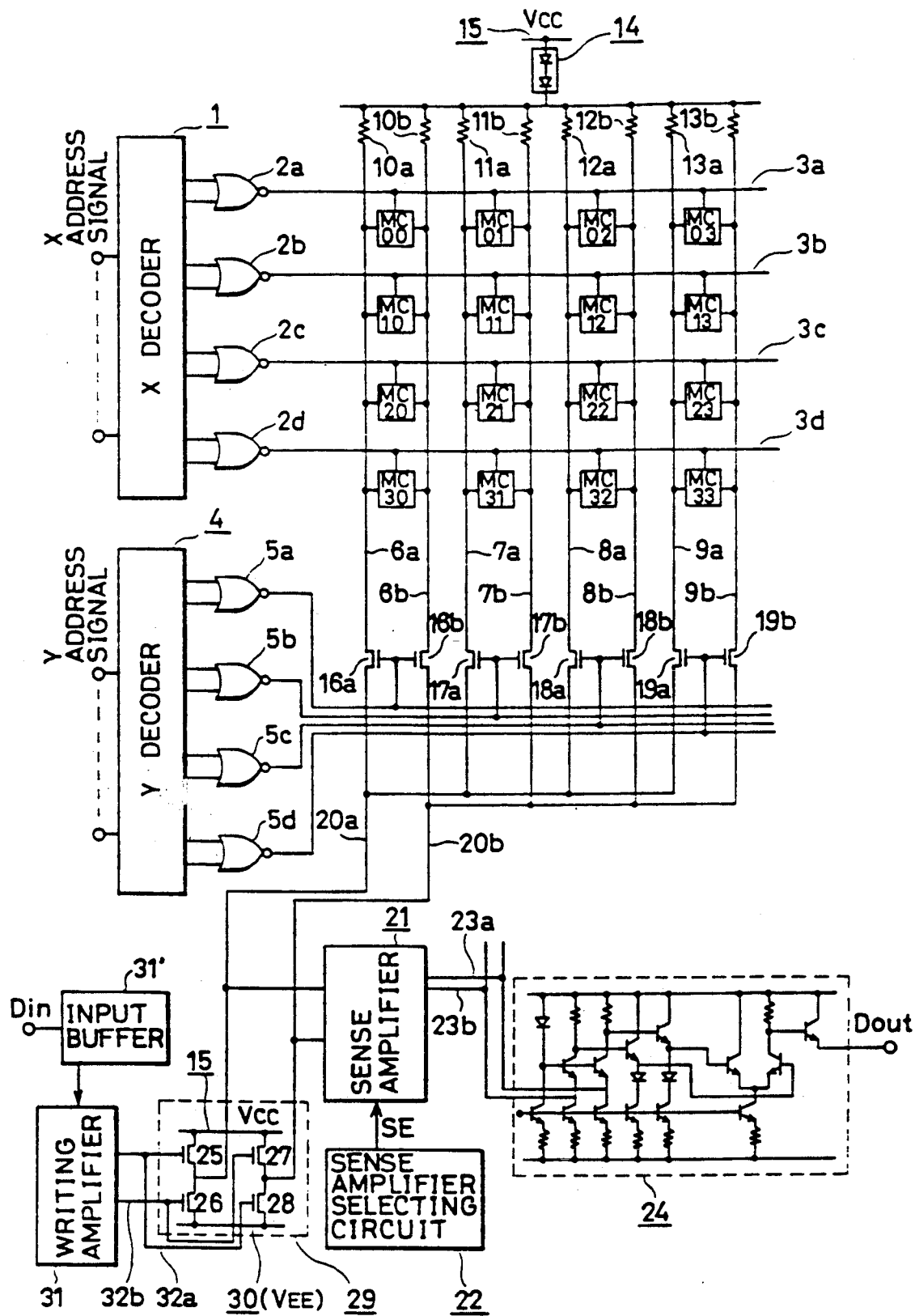
FIG. 9 is a block diagram of a conventional SRAM.
Figure 10:
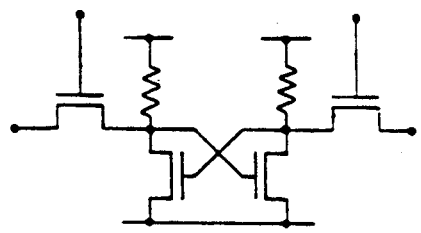
FIGS. 10 and 11 are circuit diagrams showing examples of the memory cell shown in FIG. 9.
Figure 11:
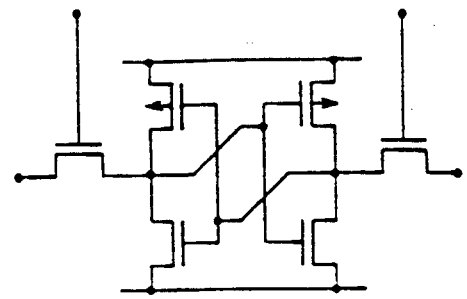
Figure 12:
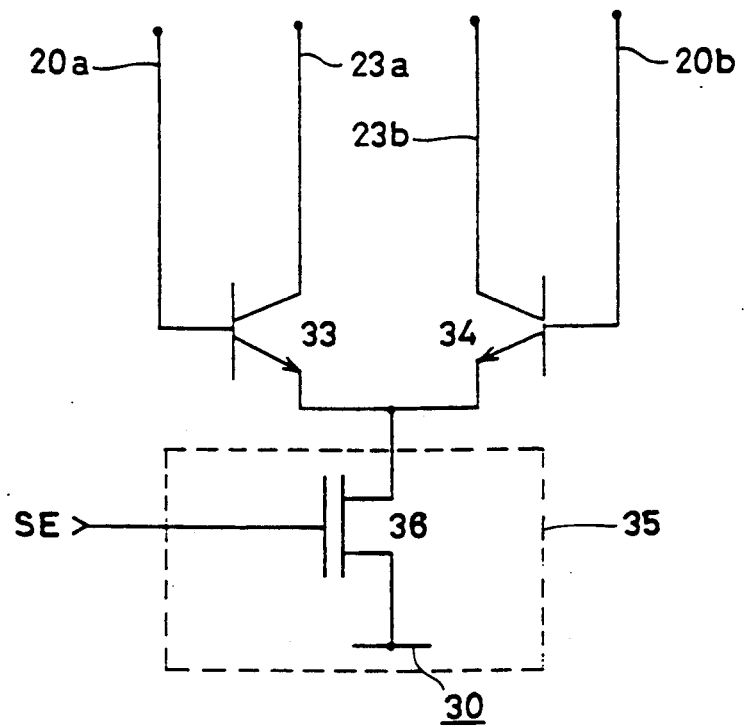
FIG. 12 is a circuit diagram of a conventional sense amplifier.

A constant current supplying circuit 35e shown in FIG. 8 is also capable of supplying constant currents to two ECL circuits similarly to that shown in FIG. 4. The constant current supplying circuit 35e basically employes the circuit 35h shown in FIG. 7. A transistor 40a has a base connected to receives a sense amplifier activating signal SE0'. A transistor 40b has a base connected to receive a sense amplifier activating signal SE1'.

It is pointed out that the constant current supplying circuits 35b through 35e respectively shown in FIGS. 2 through 8 have the same effect as that of the circuit 35a shown in FIG. 1. Namely, these circuits 35b through 35h contribute to the prevention of erroneous reading operation due to a change or a fluctuation of a power supply voltage. In addition to this, it is possible to prevent reduction of a reading speed.

It is pointed out that the sense amplifiers in the above-described embodiments are generally applicable to semiconductor memory devices as well as to SRAMs and DRAMs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier for amplifying a small potential difference generated between two signal lines, comprising:
    potential difference current converting means connected to said two signal lines for converting said potential difference signal generated between said two signal lines into a current signal,
    a constant voltage source including a power supply voltage, said constant voltage source generating a predetermined constant voltage independent of changes in said power supply voltage,
    a constant current source means for generating a constant current based on said constant voltage generated from said constant voltage source, said constant current generated being independent of changes of said power supply voltage,
    means responsive to an activating signal for activating said sense amplifier,
    said constant current source means being responsive to said activating signal for supplying said constant current to said potential difference current converting means, and
    means responsive to said current signal outputted from said potential difference current converting means for generating a voltage signal.

2. A sense amplifier according to claim 1, wherein said constant current source means comprises:
    a constant current generating means for receiving said constant voltage generated from said constant voltage source to generate a first constant current,
    at least one current-mirror means for receiving said first constant current generated by said constant current generating means and generating a second constant current being a predetermined multiple of said first constant current,
    said at least one current-mirror means supplying said second constant current as said constant current to said potential difference current converting means, and
    activating means connected to said at least one current-mirror means responsive to said activating signal for activating said at least one current-mirror means.

3. A sense amplifier according to claim 2, wherein said at least one current-mirror means comprises:
    first and second power supply lines,
    first current-mirror means connected to said first power supply line for receiving said first constant current generated by said constant current generating means, and
    second current-mirror means connected to said second power supply line for receiving a current outputted from said first current-mirror means and generating said second constant current.

4. A sense amplifier according to claim 3, wherein said activating means comprises switching means connected between said first and second current-mirror means and being operable in response to said activating signal.

5. A sense amplifier according to claim 3, wherein said activating means comprises switching means connected between said constant current generating means and said first current-mirror means and being operable in response to said activating signal.

6. A sense amplifier according to claim 1, wherein said potential difference current converting means comprises emitter coupled logic means having two inputs, said emitter coupled logic means having said two inputs connected to said two signal lines, respectively.

7. A sense amplifier according to claim 1, wherein said potential difference current converting means has two outputs and generates two complementary current signals through said two outputs in response to said potential difference signal generated between said two signal lines,
    said means responsive to said current signal outputted from said potential difference current connecting means generates a voltage signal in response to said two complementary current signals.

8. A sense amplifier for amplifying a small potential difference generated between two signal lines, comprising:
    potential difference current converting means connected to said two signal lines for converting said potential difference signal generated between said two signal lines into a current signal;
    a constant voltage source for generating a predetermined constant voltage independent of changes in a power supply voltage;
    a constant current source for generating a constant current based on said constant voltage generated from said constant voltage source;
    means responsive to an activating signal for activating said sense amplifier;
    said constant current source being responsive to said activating signal for supplying the constant current to said potential difference current converting means; and
    means responsive to said current signal outputted from said potential difference current converting means for generating a voltage signal; wherein said constant current source includes:

a constant current generating means for receiving said constant voltage generated from said constant voltage source to generate a first constant current, at least one current-mirror means for receiving said first constant current generated by said constant current generating means and generating a second constant current being a predetermined multiple of said first constant current, said at least one current-mirror means supplying said second constant current as said constant current to said potential difference current converting means, and activating means connected to said at least one current-mirror means responsive to said activating signal for activating said at least one current-mirror means, said at least one current mirror means includes:

first and second power supply lines, first current-mirror means connected to said first power supply line for receiving said first constant current generated by said constant current generating means, and second current-mirror means connected to said second power supply line for receiving a current outputted from said first current-mirror means and generating said second constant current.

* * * * *